United States Patent
Utsugi et al.

(10) Patent No.: US 6,294,892 B1
(45) Date of Patent: Sep. 25, 2001

(54) METHOD OF MANUFACTURING ORGANIC THIN-FILM EL DEVICE

(75) Inventors: Koji Utsugi; Takeshi Saitoh; Masashi Tamegai, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/470,513

(22) Filed: Dec. 22, 1999

(30) Foreign Application Priority Data

Dec. 22, 1998 (JP) .................................. 10-365552

(51) Int. Cl.$^7$ .................................. H05B 33/10
(52) U.S. Cl. .................. 318/640; 318/630; 318/632; 427/282; 427/68; 430/7
(58) Field of Search .................. 318/599, 560, 318/561, 630, 632, 639, 640; 356/400, 401; 250/548, 557, 559.3; 345/60; 427/66, 8, 69, 70, 68, 162, 226, 561, 282; 430/7, 200, 201

(56) References Cited

U.S. PATENT DOCUMENTS

| | | |
|---|---|---|
| 4,870,289 | * 9/1989 | Sato et al. . |
| 5,114,236 | * 5/1992 | Matsugu et al. . |
| 5,155,370 | * 10/1992 | Osawa et al. . |
| 5,160,957 | * 11/1992 | Ina et al. . |
| 5,502,311 | * 3/1996 | Imai et al. . |
| 5,596,204 | * 1/1997 | Irie et al. . |
| 5,661,500 | * 8/1997 | Shinoda et al. . |
| 5,674,553 | * 10/1997 | Shinoda et al. . |
| 5,851,709 | * 12/1998 | Grande et al. . |
| 5,871,805 | * 2/1999 | Lemelson . |
| 5,904,961 | * 5/1999 | Tang et al. . |
| 6,195,070 | * 2/2001 | Shinoda et al. . |

OTHER PUBLICATIONS

T. Kusaka et al., "Development of Multi–Color Organic EL Display", NEC Technical Journal, vol. 51, No. 10, (1998).
S. Miyaguchi et al., "Organic Full Color Passive–Matrix Display", *Extended Abstracts*, The Fourth International Conference on the Science and Technology of Display Phosphors, Sep. 14–17, 1998 (USA).

* cited by examiner

*Primary Examiner*—Paul Ip
(74) *Attorney, Agent, or Firm*—Hutchins, Wheeler & Dittmar

(57) ABSTRACT

In a method of manufacturing an organic thin-film electroluminescent device, a plurality of thin-film luminescent portions are arranged with fine pitches on a substrate. Each of the luminescent portions is formed by organic electroluminescent material or electrode material. A mask pattern is arranged on a pattern mask moving stage which finely moves in a predetermined direction. The substrate is arranged on a substrate moving stage. The substrate is opposed against the pattern mask with a predetermined pitch. An initial positioning alignment between the substrate and the pattern mask is performed by adjusting the substrate moving stage. The luminescent material is vaporized onto a surface of the substrate through the pattern mask. The luminescent material is vaporized on the surface of the substrate after moving the pattern mask onto a non-vaporizing portion of the surface of the substrate.

24 Claims, 9 Drawing Sheets

METHOD OF MANUFACTURING ORGANIC THIN-FILM EL DEVICE

BACKGROUND OF THE INVENTION

This invention relates to a method of manufacturing an organic thin-film EL (Electroluminescent) device in which a plurality of thin-film luminescent portions formed by organic EL luminescent material or electrode material on a substrate surface are arranged to a matrix shape with fine pitches.

In particular, this invention relates to a method of manufacturing the organic thin-film EL device for forming the luminescent portions with a pattern mask by using vacuum vaporizing method.

In an organic thin-film EL (Electroluminescent) device, holes are injected from an anode into a luminescent layer while electrons are injected from a cathode into the luminescent layer.

Under this circumstance, the holes and the electrons recombine in the luminescent layer, and emit a light beam via an excitation state.

In this case, examination has been made about a variety device structures in accordance with nature of luminescent material of the luminescent layer with respect to the organic thin-film layer.

Basically, the device is structured by sandwiching the organic luminescent layer, which emits a strong fluorescent light beam, between the anode and the cathode.

Further, it is effective to arrange a charge injecting and transporting layer, such as, a hole injecting and transporting layer and an electron injecting and transporting layer or to dope guest molecule into the organic luminescent layer in order to achieve high luminescent efficiency and stable drive.

Moreover, another examination has been made about electrode material in particular, the cathode material to enhance the luminescent efficiency and lifetime characteristic.

Meanwhile, performance for a practical use has been realized by improving a device structure or device material, although not sufficient.

Recently, report has been made about a prototype of an organic thin-film EL display having multi-color as application of the organic thin-film EL device.

Still another examination has been made about a variety of methods as the color system of the organic thin-film EL display having multi-color. The color system includes a system (three color independent luminescent system) in which luminescent devices having the respective colors are arranged on a substrate in parallel, a system (CCM system) in which a color conversion layer is provided in a light taking-out plane using blue luminescent as an EL luminescent source, and a system (color filter system) in which white luminescent is used as an EL luminescent source and full-color display is carried out using a color filter.

In this event, the three-color independent luminescent system is superior from the viewpoint of effectively utilizing luminescent efficiency with a simple structure.

Another report has been made about the color organic thin-film EL display, which has 5.7 inch at diagonal and pixels of 320× 240, as a prototype of the color organic thin-film EL display utilizing the color independent luminescent system, in NEC Technical Journal, vol. 51, No.10, pp. 28–32 (1998).

In this event, pixel size of the display is equal to 0.36 mm×0.36 mm while sub-pixel pitch of the luminescent layer (namely, the luminescent portion) is equal to 0.12 mm (120 $\mu$m). Herein, it is to be noted that the pitch of the sub-pixel means a distance from an edge of one luminescent portion to an edge of the adjacent luminescent portion.

Similarly, still another report has been made about a full-color organic thin-film EL display, which has 5.7 inch at diagonal and pixels of 320×240 in Extended Abstracts of 9-th International Workshop on Inorganic and Organic Electro-luminescence, September 14–17, pp. 137–140 (1998).

In this case, trio-pitch of the luminescent portion of the display is equal to 0.33 mm (330 $\mu$m) while the sub-pixel pitch is equal to 0.11 mm (110 $\mu$m).

In the organic thin-film EL device due to the three-color independent luminescent system, it is possible to obtain high luminescent efficiency with a simple structure. However, the sub-pixel pitch of the pixel is equal to about 100 $\mu$m or more, like the prototype of the above-mentioned two color organic thin-film EL displays.

It is necessary not only to develop a pattern mask of high accuracy, but also to develop a manufacturing method using a fine moving mechanism of a pattern mask having sufficient accuracy in order to finely separate a luminescent layer formed by excessively thin organic vaporized film into a sub-pixel of high accuracy of several tens $\mu$m.

SUMMARY OF THE INVENTION

It is therefore an object of this invention to provide a method of manufacturing an organic thin-film EL device which is capable of finely separating with sub-pixel pitch of about several tens $\mu$m and which is capable of achieving sufficient color separating accuracy or sufficient separating accuracy of an electrode.

In a method of manufacturing an organic thin-film electroluminescent device, a plurality of thin-film luminescent portions are arranged with fine pitches on a substrate. In this event, each of the luminescent portions is formed by organic electroluminescent material or electrode material.

Under such a circumstance, a mask pattern is arranged on a pattern mask moving stage which finely moves in a predetermined direction.

Next, the substrate is arranged on a substrate moving stage.

Subsequently, the substrate is opposed against the pattern mask with a predetermined pitch.

Successively, an initial positioning alignment between the substrate and the pattern mask is performed by adjusting the substrate moving stage.

Next, the luminescent material is vaporized onto a surface of the substrate through the pattern mask.

Further, the luminescent material is vaporized on the surface of the substrate after moving the pattern mask onto a non-vaporizing portion of the surface of the substrate by moving the pattern mask moving stage in parallel to the substrate.

Whereby, arrangement of the luminescent portions is formed on the surface of the substrate.

In this condition, the pattern mask moving stage independently and finely moves in X and Y directions perpendicular to each other for a pattern plane by controlling and driving by a pulse control motor. The pulse control motor may be a DC servo motor.

The substrate moving stage comprises a z-axis gate means which adjusts a distance and a swing angle or a shifting angle between the substrate and the pattern mask, a rotation means which adjusts a rotation angle between the substrate and the pattern mask, and a substrate moving means which moves the substrate in parallel to the pattern mask in order to achieve fine adjustment.

In this case, the z-axis gate means is finely controlled and driven by the pulse control motor. The rotation means is finely controlled and driven by the pulse control motor. Further, the substrate moving means is finely controlled and driven by the pulse control motor. The pulse control motor may be a DC servo motor.

The pattern mask moving stage comprises a z-axis gate means which adjusts a distance and a swing angle between the substrate and the pattern mask, a rotation means which adjusts a rotation angle between the substrate and the pattern mask, and a pattern mask moving means which moves the pattern mask in parallel to the substrate in order to achieve fine adjustment.

In this case, the z-axis gate means is finely controlled and driven by the pulse control motor. The rotation means is finely controlled and driven by the pulse control motor. Further, the pattern mask moving means is finely controlled and driven by the pulse control motor. The pulse control motor may be a DC servo motor.

The pulse control motor is driven and controlled by the use of a digital input instruction system containing a feedback system.

In this event, the digital input instruction comprises incremental instruction.

The pulse control motor has a rotation angle sensor. In this case, the rotation angle sensor has a pulse encoder of an incremental instruction system.

Further, a magnetic suction pattern mask is preferably utilized, and a magnetic field generating source is arranged at a backside in which the luminescent portions are not formed on the substrate. Whereby, the pattern mask is sucked to the substrate surface by the use of the magnetic field.

Moreover, an insulating pitch may be formed at a surface in which the luminescent portions are formed. In this event, a film thickness of the insulating pitch may be thicker than a film thickness of the luminescent portion.

DESCRIPTION OF PREFERRED EMBODIMENT

Figure 1:
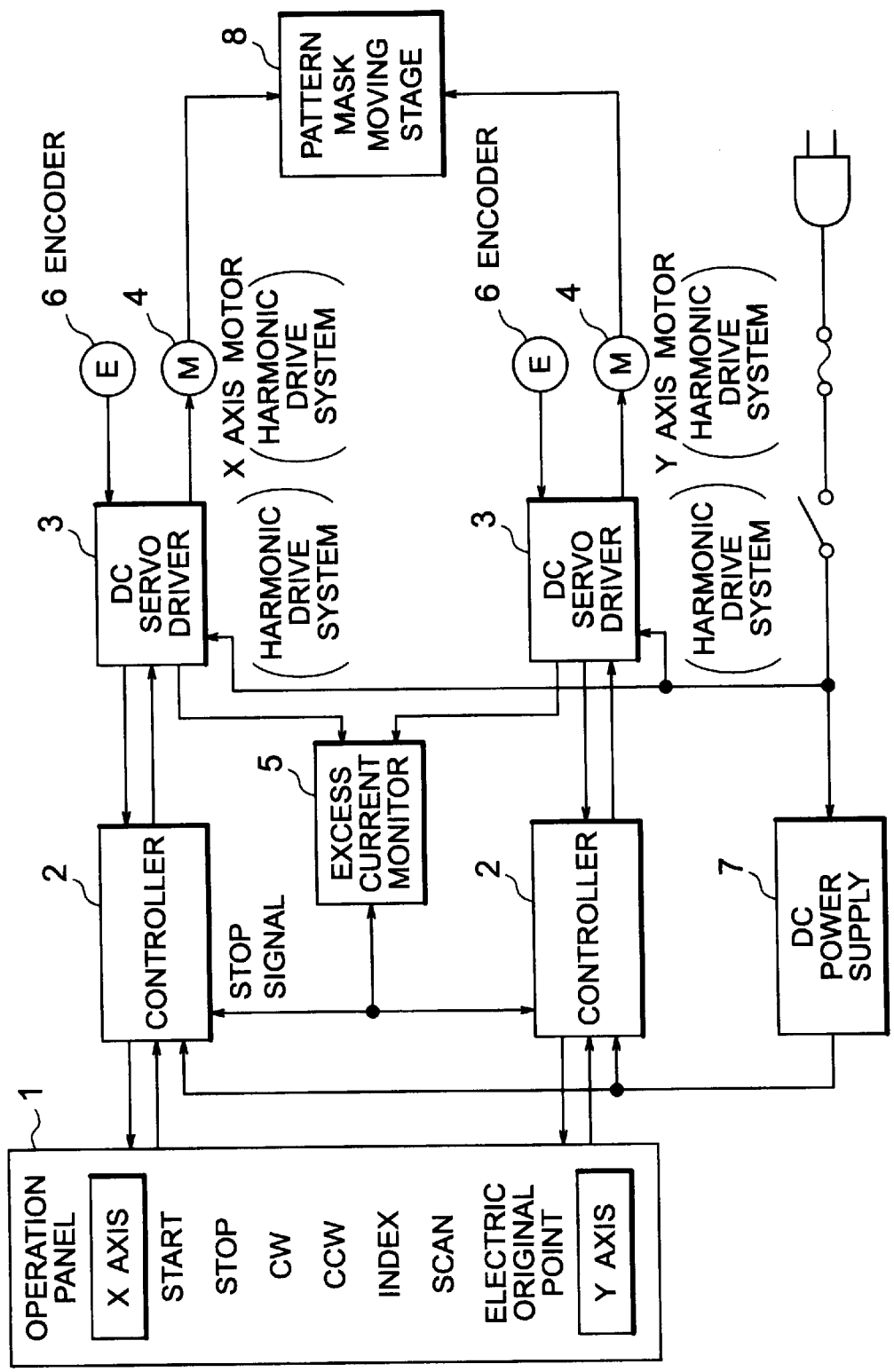
FIG. 1 is a block diagram of a control portion of an accurate moving mechanism of a pattern mask used in examples 1 through 4 of this invention.

Hereinafter, description will be made about an embodiment of this invention in detail.

First, description will be made about an example of a pattern mask fine moving mechanism of this invention.

A substrate is arranged on a substrate table (a holder) by the use of a substrate holding spring. The substrate holder is provided at a rotation table. A rough movement in a Y-direction of the substrate is carried out using a micrometer. Adjustment of a rotation angle for the pattern mask is performed by moving the rotation table by the use of a rotation knob.

Further, the substrate table can be moved upwards and downwards by using a micrometer for adjusting the substrate up and down, and be used to adjust a distance (gap) between the substrate and the pattern mask.

The pattern mask having the pattern is preferably made of metal. Further, the pattern mask is attached to the mask table which has pattern mask holding function and is manufactured by taking prevention of deflection into consideration, and is arranged at the pattern mask moving stage consisting of a X-Y stage.

The pattern mask fine moving mechanism of the pattern mask moving stage has movement quantity adjusting function driven by a pulse control motor which aligns a position for the substrate and finely separates the luminescent portion.

The pattern mask fine moving controller driven by this pulse control motor can control via feedback a speed and a position due to digital input (incremental) instruction which contains a speed feedback system. Meanwhile, it is to be noted that the pulse control motor may be a DC servo motor.

The above-mentioned controller is composed of a digital control unit of an incremental instruction input method which is designed so as to control various servomotors.

The speed of the pulse control motor can be controlled in proportional to the speed of the instruction-input pulse (pulse rate) by using the controller. Further, positioning control due to rotation quantity (rotation angle) of the motor can be carried out in proportional to the pulse number.

The motor has a pulse encoder of the incremental method as a rotation angle sensor. A rotation angle of the motor corresponding to resolution of one pulse of the encoder is equal to 1 bit instruction.

When the instruction pulses are given thereto, the pulses are estimated by the use of the deviation counter, and the quantity is converted into a voltage via a D/A (digital/analog) converter. This voltage is given to a servo-amplifier as a speed instruction signal.

Consequently, the voltage is applied to the motor, and the motor starts the rotation. The pulse generated from the encoder in accordance with the rotation of the motor is feedback to the deviation counter, and subtraction is carried out by the deviation counter.

In consequence, input pulse speed and feedback pulse speed is in an equiblium state during the instruction pulses continue to be inputted in the condition that a constant deviation quantity (deviation pulse) is kept in the counter. Under this circumstance, the motor continues to rotate at the speed in synchronized with the pulse.

When instruction input halts, the deviation counter performs only subtraction due to feedback pulse. Thereby, the deviation quantity and the speed instruction signal given to the servo-amplifier in accordance with the deviation quantity are rapidly reduced to decelerate the motor. When the deviation becomes zero, the motor halts. Consequently, the motor rotates with an angle equivalent to the instruction input pulse quantity.

When the instruction pulse is halted and the motor halts, the deviation is in a zero state if the motor is in a no-loading state. However, when loading torque is applied to the motor, the motor is displaced in rotation by the loading torque, and the deviation quantity corresponding to the displacement occurs in the deviation counter.

As a result, load resistance torque generates for the motor, and a halting state is kept by antagonism. Thus, the pattern mask can be finely moved with a desired moving quantity in accordance with an electrical original point and the set pulse number.

The fine adjustment of the positioning alignment between the pattern mask and the substrate can be carried out by using the above-mentioned mechanism, operating both the substrate moving stage and the pattern mask moving state, and monitoring by the use of a microscope or a CCD camera.

In this event, the control drive due to the pulse control motor is applied for the X, Y stage for finely moving the pattern mask. Specifically, the pattern mask moving stage comprises a z-axis gate mechanism which adjusts a distance and a swing angle between the substrate and the pattern mask, a rotation mechanism which adjusts a rotation angle between the substrate and the pattern mask, and a pattern mask moving mechanism which moves the pattern mask in parallel to the substrate in order to achieve fine adjustment. In this case, the z-axis gate mechanism, the rotation mechanism, and the pattern mask moving mechanism are controlled and driven by the pulse control motor, respectively. The pulse control motor may be a DC servo motor. If needed, the control drive can be applied for a substrate moving stage consisting of a Z angle stage for changing a distance and a swing angle or a shifting angle between the substrate and the pattern mask, a rotation stage for adjusting a rotation angle between the substrate and the pattern mask, and a Y stage for performing rough movement and fine adjustment in a Y direction. In this event, the Z angle stage, the rotation stage, and the Y stage are controlled and driven by the pulse control motor, respectively. The pulse control motor may be a DC servo motor.

In accordance with this invention, a magnet is arranged at a back surface side of the substrate. With this structure, a pattern mask having magnetic suction performance is sucked by magnetic field. Thereby, a pitch between the substrate surface and the pattern mask can be adjusted. As the pitch is larger, the color separating accuracy becomes lower.

In particular, the pattern pitch becomes finer, the affect thereof becomes larger. Consequently, it is effective to suck the pattern mask by the magnetic field as needed. Herein, it is to be noted that a permanent magnet or an electro-magnet may be applicable as the above-mentioned magnet.

Although shape or size thereof is not particularly restricted, the magnet must be designed so that suction force in a vertical direction for the substrate surface is uniformly applied for the entire pattern surface of the pattern mask.

Although the pattern mask sucked by the magnetic field is not particular restricted, it is effective to use material containing magnetic element, such as, nickel, cobalt, and iron, or material plated by nickel and like.

It is also effective to use a substrate in which an insulating pitch is arranged at the surface side of the substrate. In this case, the pitch is provided in a substantially perpendicular direction for the substrate surface, and has a film thickness thicker than a film thickness of the luminescent portion.

For example, even when the pitch between the pattern mask and the substrate becomes excessively small by the magnetic field and the substrate joins with the pattern mask, patterning can be carried out without giving damage for the organic thin-film of the luminescent portion by the pitch.

Further, no damage is given for the electrode or the organic film by the effect of the pitch in the formation of the cathode even when the substrate of the luminescent region may join with the pattern mask. Herein, it is to be noted that the pitch may be formed by the total or the part of black matrix.

Alternatively, when the pitch is used, the fine separation of the electrode is, for example, conducted by the use of the pitch without the use of the pattern mask, and the pattern mask may be used only during the formation of the organic EL thin-film by the method according to this invention.

Although a manufacturing method or material of the pitch is not particularly restricted, a manufacturing method by the use of the photolithography is simple. In this case, height of the pitch must be thicker than film thickness of the luminescent portion. The upper limit of the height must be selected such that process accuracy is not degraded by entrance of vaporizing material.

Specifically, it is preferable that the height falls within the range between about 0.2 $\mu$m and 200 $\mu$m. when the pitch is formed to a stripe shape in a form in which the pitch crosses with either one of electrode lines, the luminescent portion is readily formed.

In this event, the pitch may be formed in every region except a portion in which the luminescent portion is formed. Further, it is unnecessary that the pitch is formed to the stripe shape or the line shape.

The structure of the organic thin-film EL device according to a manufacturing method of this invention is exemplified as follows, (1) the anode/the hole injecting and transporting layer of a single layer or a multi-layer/the luminescent layer of the single layer or the multi-layer.

(2) the anode/the luminescent layer of the single layer or the multi-layer/the electron injecting and transporting layer of the single layer or the multi-layer/the cathode.

(3) the anode/the hole injecting and transporting layer of the single layer or the multi-layer/the luminescent layer of the single layer or the multi-layer/the electron injecting and transporting layer of the single layer or the multi layer / the cathode.

Further, a protection layer or an interface layer may be inserted between the cathode and the anode as needed.

The luminescent portions formed by the organic EL luminescent material must be independently separated to manufacture the organic thin-film EL device of the multi-color or the full-color. On the other hand, the formation of the electron injecting and transporting layer may be separated at every color or may be common for the respective luminescent colors.

The hole-transporting material used as the hole injecting and transporting layer is not particularly restricted. For example, triarylamine derivative, oxadiazole derivative, poryphrin derivative, stilbene derivative, or base material in which these hole-transporting materials are dispersed into the known macromolecule medium can be used as the hole-transporting material.

Material, which does not extremely prevent the hole-transporting performance, is preferably selected as the above-mentioned macromolecule. For example, poly-(N-vinylcarbazole), polycarbonate, polymethylacrylate, polymethylmethacrylate, polystyrene-based polymer, polysililen-based polymer, polythiohen, polyaniline, polyphenylenevinylene may be applicable.

Further, the hole injecting and transporting layer is not limited to the organic material, and an inorganic semiconductor having the hole conductivity may be, for example, used as the hole injecting and transporting layer. In this case, the hole injecting and transporting layer may be formed by the single layer or the multi-layer. If necessary, a side, which contacts with the anode, is used as the hole injecting and layer, and the adjacent layer may be separated from the hole-transporting layer.

The luminescent material of the organic thin-film EL device is not particularly restricted in this invention, and the known organic EL luminescent material can be used.

For example, 8-hydroxyquinoline and metal complex of the derivative thereof, tetraphenylbutadiene derivative, distyrylaryle derivative, triarylamine derivative; coumarin based derivative, quinachrydon derivative, perylene based derivative, polymethine based derivative, anthracene derivative are exemplified.

The electron injecting and transporting layer can be provided between the luminescent portion and the cathode as needed in this invention. The electron carrying material of the electron injecting and transporting layer is not particularly restricted. For example, 8-hydroxyquinoline metal complex or oxadiazole derivative can be used as the electron injecting material.

The anode of the organic thin-film EL device serves to inject the holes into the hole injecting and transporting layer or the luminescent portion, and preferably has work function of 4.5 eV or more. As a specific example of the anode material, indium tin oxide alloy (ITO), tin oxide (NESA), zinc-indium oxide, gold, silver, platinum, and copper are exemplified.

Material having low work function is desirable as the cathode in order to inject the electrons into the electron injecting and transporting layer or the luminescent layer. Although the material thereof is not particularly restricted, indium, aluminum, magnesium, magnesium-indium alloy, magnesium-silver alloy, magnesium-aluminum alloy, aluminum-lithium alloy, and aluminum-scandium-lithium alloy are exemplified.

In this event, it is preferable that a sealing layer, which is formed by metal oxide, metal sulfide, and metal fluoride, is provided in order to protect from oxide or moisture in the above-mentioned organic thin-film EL device.

EXAMPLES

Example 1

(Drive/control portion for positioning and fine movement of the pattern mask)

As illustrated in FIG. 1, an operation panel 1 is put into a scan mode to select a forward movement or a backward movement. When a power supply 7 is turned on, and a start switch of the operation panel 1 is pushed, pulses are sent from a controller 2 into a DC servo-driver 3 during pushing duration.

Thereby, a motor 4 rotates. The motor 4 has a rotation angle sensor consisting of an encoder 6. With this structure, a pattern mask moving stage 8 having a pattern mask moves for a substrate during the start switch is pushed.

Subsequently, when the start switch is pushed in an electric original point mode, the pushed point becomes the electric original point and becomes a start point of an index mode.

When the operation panel 1 is put into the index mode, pulses are sent into a DC servo-driver 3 with the pulse number of a value set by eight number for index (0–7 in this example) of the controller 2. Thereby, the motor 4 rotates with motor rotation quantity (0.0174 $\mu$m in this example)=A $\mu$m for the set pulse number×1 bit on a motor axis.

In this case, the forward movement and backward movement switches are ignored, and the forward movement and the backward movement are determined by ± of the set value of the index (0–7). An excessive current motor 5 gives a stop signal into the controller 2 by utilizing an increase of the current when the motor 4 is put into an excessive load.

By using a manufacturing apparatus of the organic thin-film EL device having such a control portion, positioning and fine movement are carried out between the substrate and the pattern mask.

(Substrate and Pattern Mask)

Noon-alkali glass (HOYA-NA40) of 50 mm×50 mm×1.1 mm was used as the substrate. ITOs were formed with the 240 number to the stripe shape with a width of 70 $\mu$m and a pitch of 30 $\mu$m in a Y direction on the substrate. Further, a marker (ITO) for positioning alignment was provided at four corners of the substrate.

The pattern mask was made of copper, and the surface thereof was plated by nickel. The pattern mask had a thickness of 34 $\mu$m including the plating portion, As illustrated in FIG. 2, a pattern hole of the pattern mask forms a rectangular sub-pixel which has X (length)=280 $\mu$m, Y (width)=80 $\mu$m, a pitch of 620 $\mu$m in the Y direction, a pitch of 220 $\mu$m in the Y direction.

Figure 2:
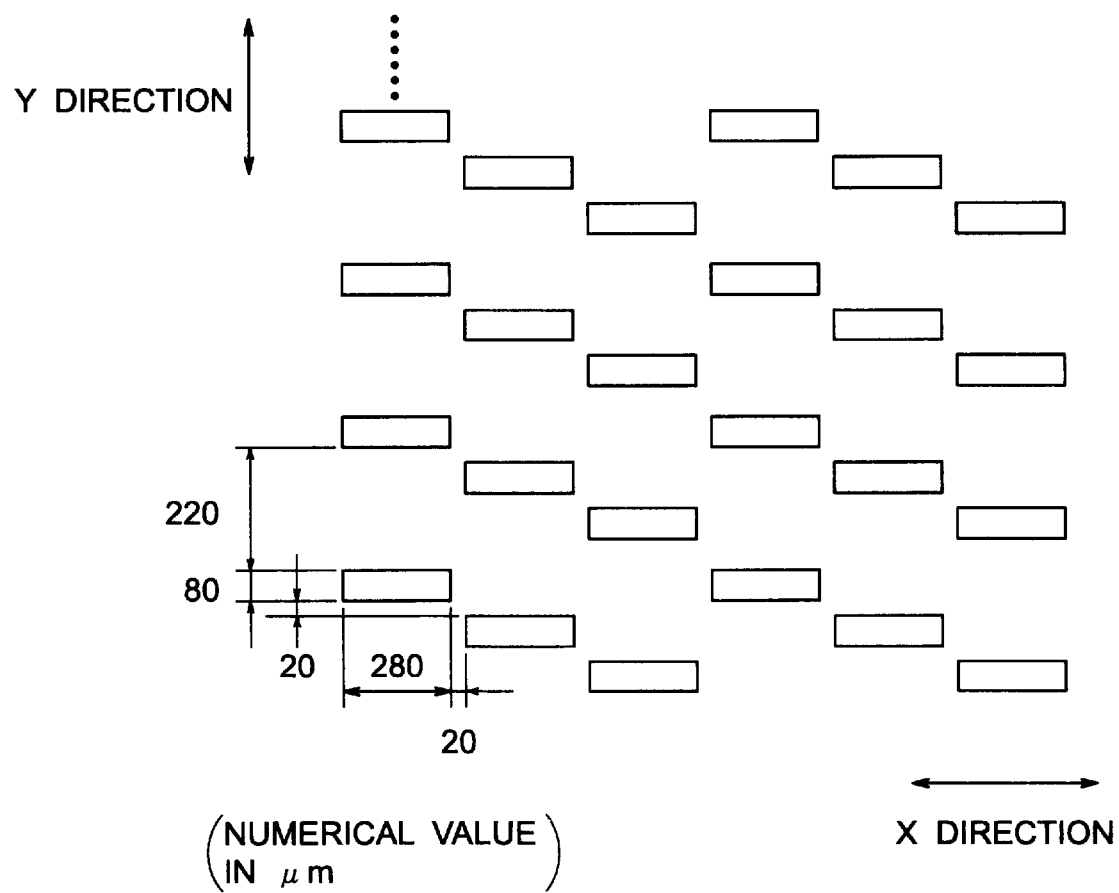
FIG. 2 is a pattern mask diagram for separating an organic luminescent portion used in examples1, 3 and 4 of this invention.

This pattern holes are arranged with a pitch of 20 $\mu$m in the X direction, and the adjacent pattern holes are arranged with deviation of 1 pixel (a width of 80 $\mu$m+a pitch of 20 $\mu$m=100 $\mu$m) in the Y direction, as illustrated in FIG. 2.

In consequence, the luminescent portions of three colors can be separated and formed by finely moving the pattern mask twice with 100 $\mu$m in the Y direction. Further, markers (holes) for the positioning alignment having the same shape as the glass substrate are formed at predetermined positions of the four corners of the pattern mask.

(Formation of the Luminescent Portion)

The pattern mask illustrated in FIG. 2 was fixed to the mask holder, and was arranged in a deposition apparatus. Next, the glass substrate having the ITO was fixed to the substrate holder, and was arranged on the pattern mask set in the deposition apparatus in advance.

Under this circumstance, the positioning alignment (marker alignment) between the pattern mask and the substrate was carried out by arranging a microscope interlocked with the monitor on an upper portion of the substrate and monitoring by the monitor.

During the positioning alignment, the movement of the substrate was carried out by the use of rough mechanism due to the micrometer, and the file movement of the pattern mask was performed by the use of the above-mentioned fine movement control mechanism due to the pulse control motor 4. Herein, it is to be noted that the pitch between the substrate and the mask was set to 50 $\mu$m by the micrometer.

The organic EL luminescent material was filled or packed in a molybdenum board, and was arranged in a vaporizing source of load-lock system.

Further, a first luminescent material was vacuum-vaporized from directly beneath of the substrate (angle between substrate center and vaporizing source: 0 degree) at deposition rate of 0.2–0.5 nm/s under vacuum of $1.0 \times 10^{-4}$ Pa to the thickness of 50 nm to form arrangement of a first luminescent portion.

Subsequently, the pattern mask is moved with 100 $\mu$m in the Y direction. Further, a second luminescent material was vacuum-vaporized from directly beneath of the substrate at deposition rate of 0.2–0.5 nm/s under vacuum of $1.0 \times 10^{-4}$ Pa to the thickness of 50 nm to form arrangement of a second luminescent portion.

Further, the pattern mask is moved with 100 $\mu$m in the Y direction. Further, a third luminescent material was vacuum-vaporized from directly beneath of the substrate at deposition rate of 0.20–0.5 nm/s under vacuum of $1.0 \times 10^{-4}$ Pa to the thickness of 50 nm to form arrangement of a third luminescent portion.

Figure 3:
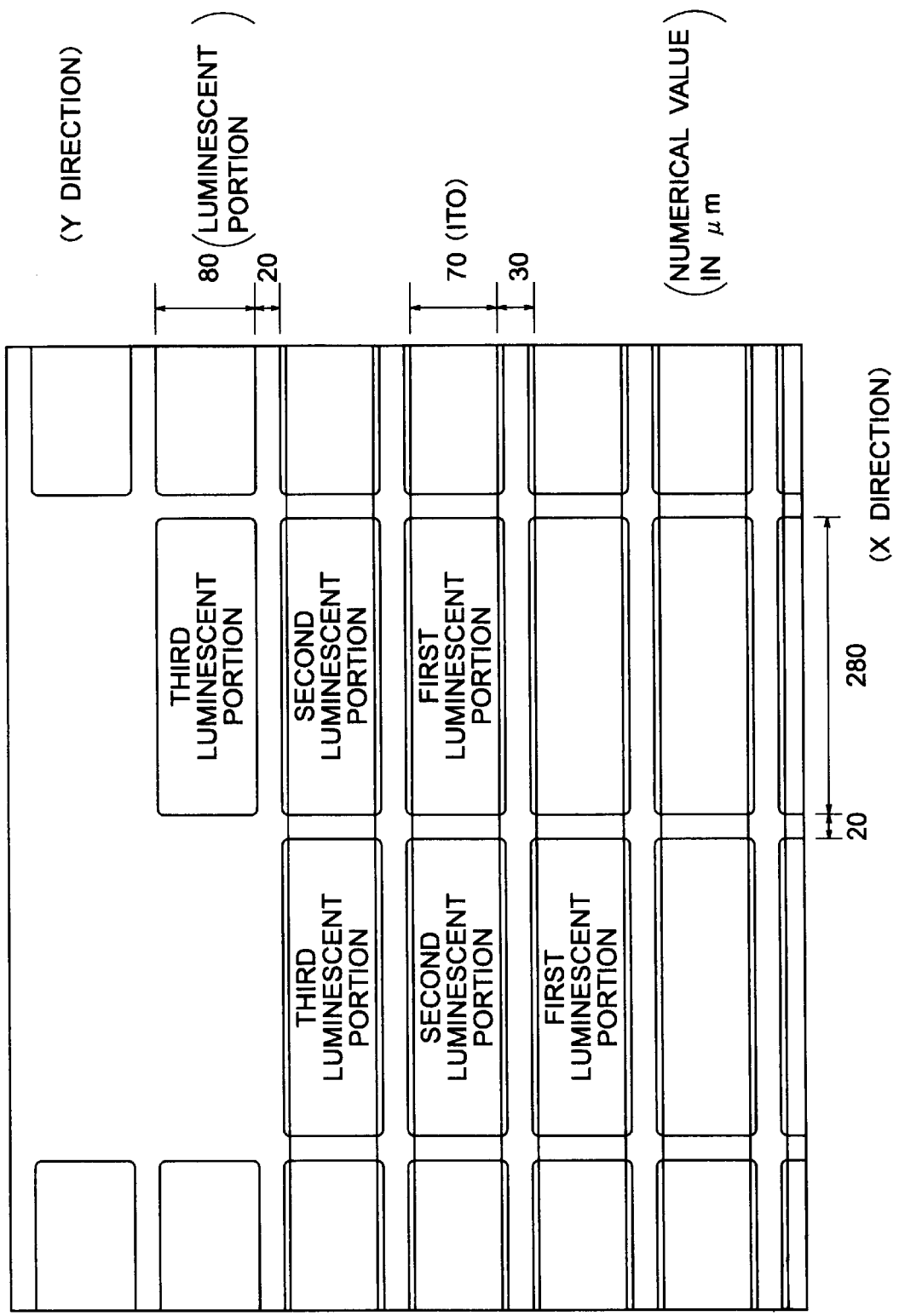
FIG. 3 is an arrangement diagram of a luminescent portion showing fine separating example of an organic luminescent portion of example 1 which is obtained by finely moving a pattern mask illustrated in FIG. 2.

The arrangement state of the luminescent portions on the substrate manufactured as described above is illustrated in FIG. 3. It is found out that the first through the third luminescent portions are sequentially aligned in the Y direction, and all of the luminescent portions are aligned on the ITO line extended in the X direction of the substrate. Herein, it is to be noted that a part of the substrate is illustrated in FIG. 3.

As the result of the microscope observation, deviation from the specified value of the luminescent portion in the X direction and Y direction is equal to several $\mu$m at maximum, respectively, and falls within the permitted range of the ITO line and the pitch (L/S=70 $\mu$m/30 $\mu$m, namely 100 $\mu$m pitch).

The result of the example 1 can be achieved by the manufacturing method of the organic thin-film EL device of this invention having the pattern mask fine mechanism and the substrate position adjusting mechanism due to the pulse control motor 4, as illustrated in the block diagram of FIG. 1.

It is confirmed from the result that the accurate positioning between the substrate and the pattern mask, and the accurate fine movement of the pattern mask can be carried out by the manufacturing method of the organic thin-film EL device according to this invention.

Example 2
(Substrate and Pattern Mask)
Non-alkali glass (HOYA-NA40) of 50 mm×50 mm×1.1 mm was used as the substrate. ITO was not formed on the substrate. The pattern mask was made of copper, and the surface thereof was plated by nickel. The pattern mask had a thickness of 34 $\mu$m.

Figure 4:
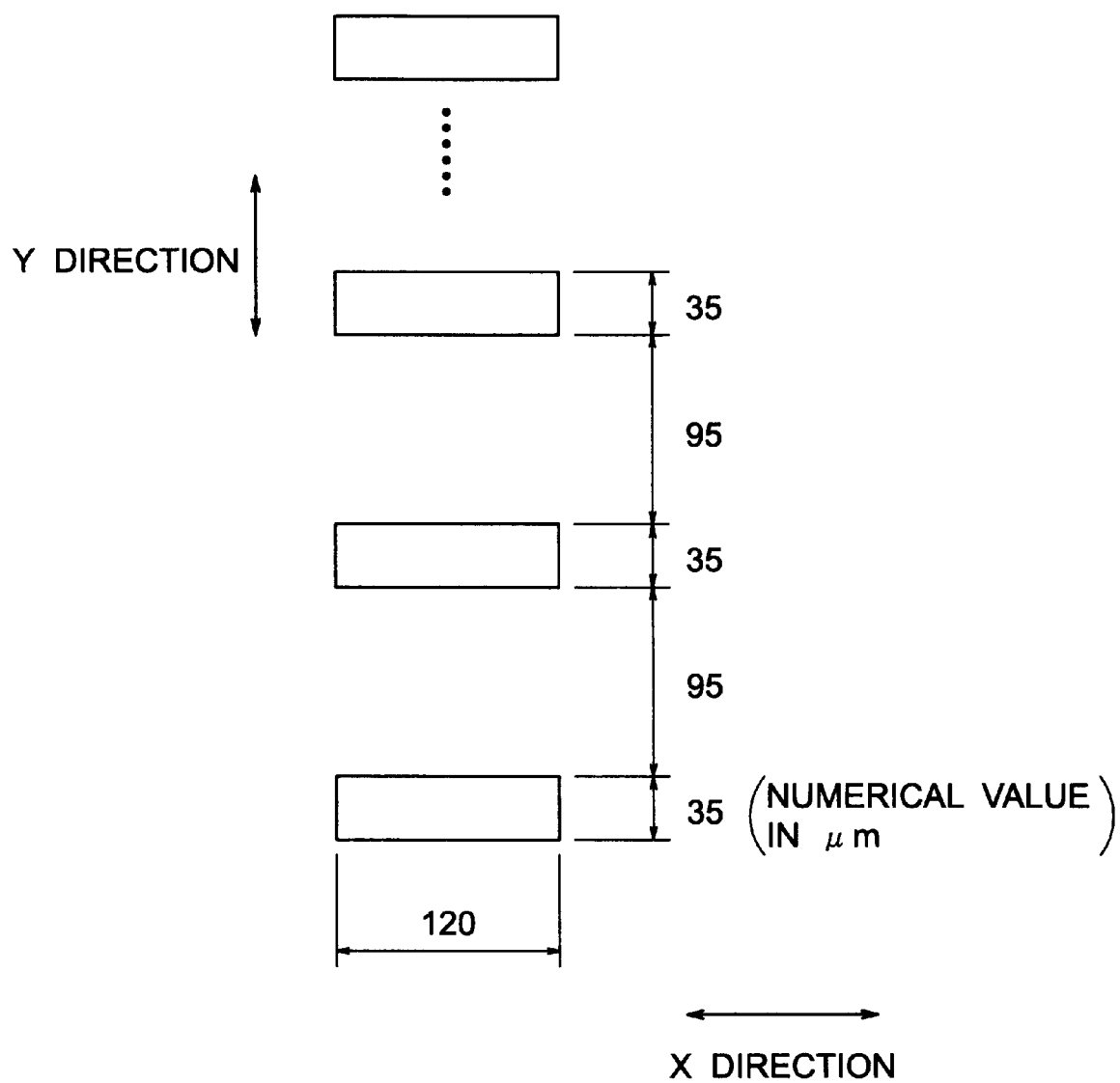
FIG. 4 is a pattern mask diagram for separating an organic luminescent portion used in an example 2 of this invention.
Figure 5:
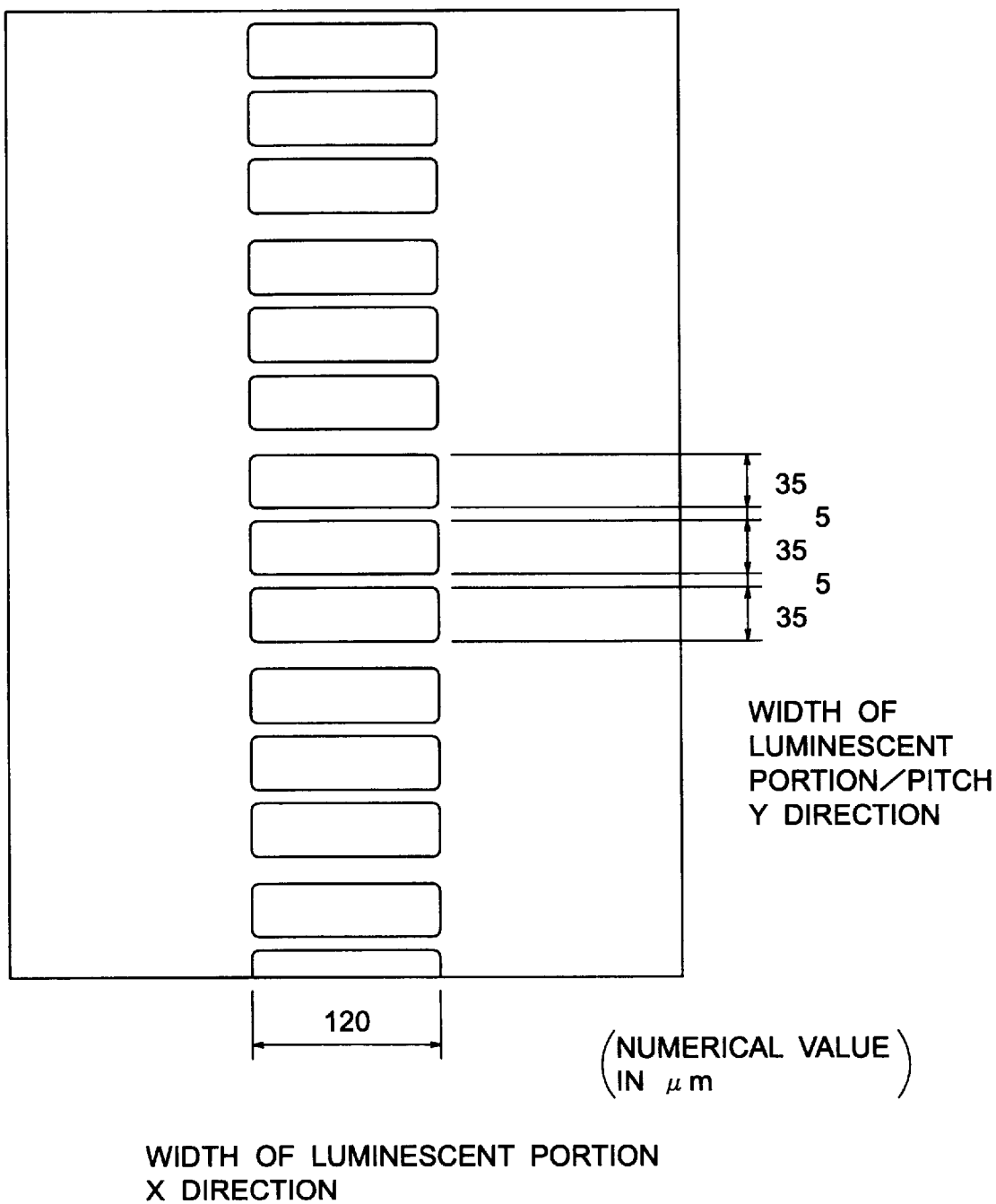
FIG. 5 is an arrangement diagram of a luminescent portion showing fine separating example of an organic luminescent portion of example 2 which is obtained by finely moving a pattern mask illustrated in FIG. 4.

As illustrated in FIG. 4, a pattern hole for forming a rectangular sub-pixel, which has X=120 $\mu$m width, Y=35 $\mu$m width, a pitch of 95 $\mu$m in the Y direction, was formed in the pattern mask.

The three kinds of luminescent portions can be separated by finely moving the pattern mask twice with 40 $\mu$m in the Y direction. Further, markers (holes) for the positioning alignment having the same shape as the glass substrate were formed at predetermined positions of the four corners of the pattern mask.

(Formation of the Luminescent Portion)
In the example 1, the formation of the luminescent portion was carried out by the same method as the example 1.

When the mask having the width of 35 $\mu$m was moved with 40 $\mu$m in the Y direction, the separation of the luminescent portion having the width of about 35 $\mu$m and the pitch of about 5 $\mu$m could be almost achieved. Therefore, it is possible to form the luminescent portion which has the width of 35 $\mu$m on a line having ITO width of 30 $\mu$m.

From the result of the example 2, it is possible to form the luminescent portion (sub-pixel) of several tens $\mu$m pitch by the manufacturing method of the organic thin-film EL device according to this invention.

Example 3
(Substrate and Pattern Mask)
The difference between the example 3 and example 1 with respect to the formation of the luminescent portion is explained as follows. A movable electro-magnet was arranged the backward side of the substrate. Under this circumstance, the electro-magnet was turned on during vaporizing. When the pattern mask was finely moved, the electromagnet was turned off.

Further, it is assumed that the vaporizing source is not arranged for directly beneath of the substrate. Consequently, an angle between the substrate and the vaporizing source was set to 20 degree.

The pattern mask illustrated in FIG. 2 was fixed to the mask holder, and was arranged in a deposition apparatus. Next, the glass substrate having the ITO was fixed to the substrate holder, and was arranged on the pattern mask set in the deposition apparatus in advance.

Under this circumstance, the positioning alignment (marker alignment) between the pattern mask and the substrate was carried out by arranging a microscope interlocked with the monitor on an upper portion of the substrate and monitoring by the monitor.

The organic EL luminescent material was filled or packed in a molybdenum board, and was arranged in a vaporizing source of load-lock system.

First, the angle between the substrate and the vaporizing source was set to 20 degree under vacuum of $1.0 \times 10^{-4}$ Pa. Further, the electromagnet was turned on, and a first luminescent material was vacuum-vaporized at deposition rate of 0.2–0.5 nm/s to the thickness of 50 nm to a first luminescent portion.

Subsequently, the electromagnet was turned off, and the pattern mask was moved with 100 $\mu$m in the Y direction. Again, the electromagnet was turned on, and the angle between the substrate and the vaporizing source was set to 20 degree under vacuum of $1.0 \times 10^{-4}$ Pa.

Next, the vaporizing source position was changed from the first luminescent portion, and a second luminescent material was vacuum-vaporized at deposition rate of 0.2–0.5 nm/s to the thickness of 50 nm to form a second luminescent portion.

Again, the electromagnet was turned off, and the pattern mask was further moved with 100 $\mu$m in the Y direction. Thereafter, the electromagnet was turned on, and the angle between the substrate and the vaporizing source was set to 20 degree under vacuum of $1.0 \times 10^{-4}$ Pa.

Next, the vaporizing source position was changed from the first luminescent portion and the second luminescent portion, and a third luminescent material was vacuum-vaporized at deposition rate of 0.20~0.5 nm/s to the thickness of 50 nm to form a third luminescent portion.

Figure 6:
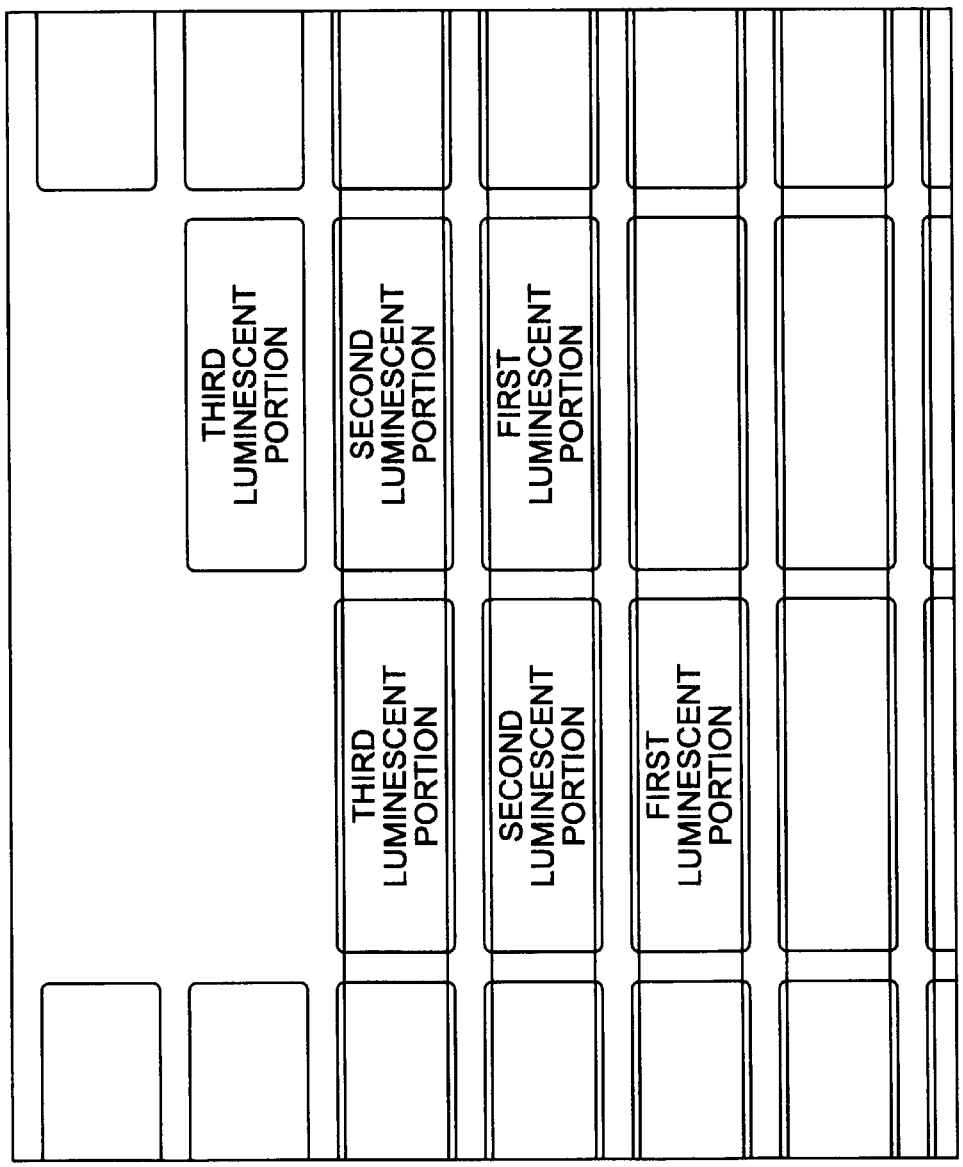
FIG. 6 is an arrangement diagram of a luminescent portion showing separating example of an organic lumines- cent portion obtained in example 3 when a pattern mask illustrated in FIG. 2 is finely moved, and a pattern mask and a substrate are joined by magnetic field during deposition.

The arrangement state of the luminescent portions on the substrate having ITO manufactured as described above is illustrated in FIG. 6. It is found out that all of the first through the third luminescent portions are aligned on the ITO line. Herein, it is to be noted that a part of the substrate is illustrated in FIG. 6.

As the result of the microscope observation, the deviation of the luminescent portion in the X direction and Y direction is equal to several $\mu$m at maximum, respectively, and falls within the permitted range of the ITO line and the pitch (L/S=70 $\mu$m/30 $\mu$m, namely 100 $\mu$m pitch).

Reference Example 1

The luminescent portion was formed by the same method as the example 3 except that the electromagnet was not arranged on the backside of the substrate. The arrangement state of the luminescent portion on the substrate having ITO thus manufactured is illustrated in FIG. 7.

Figure 7:
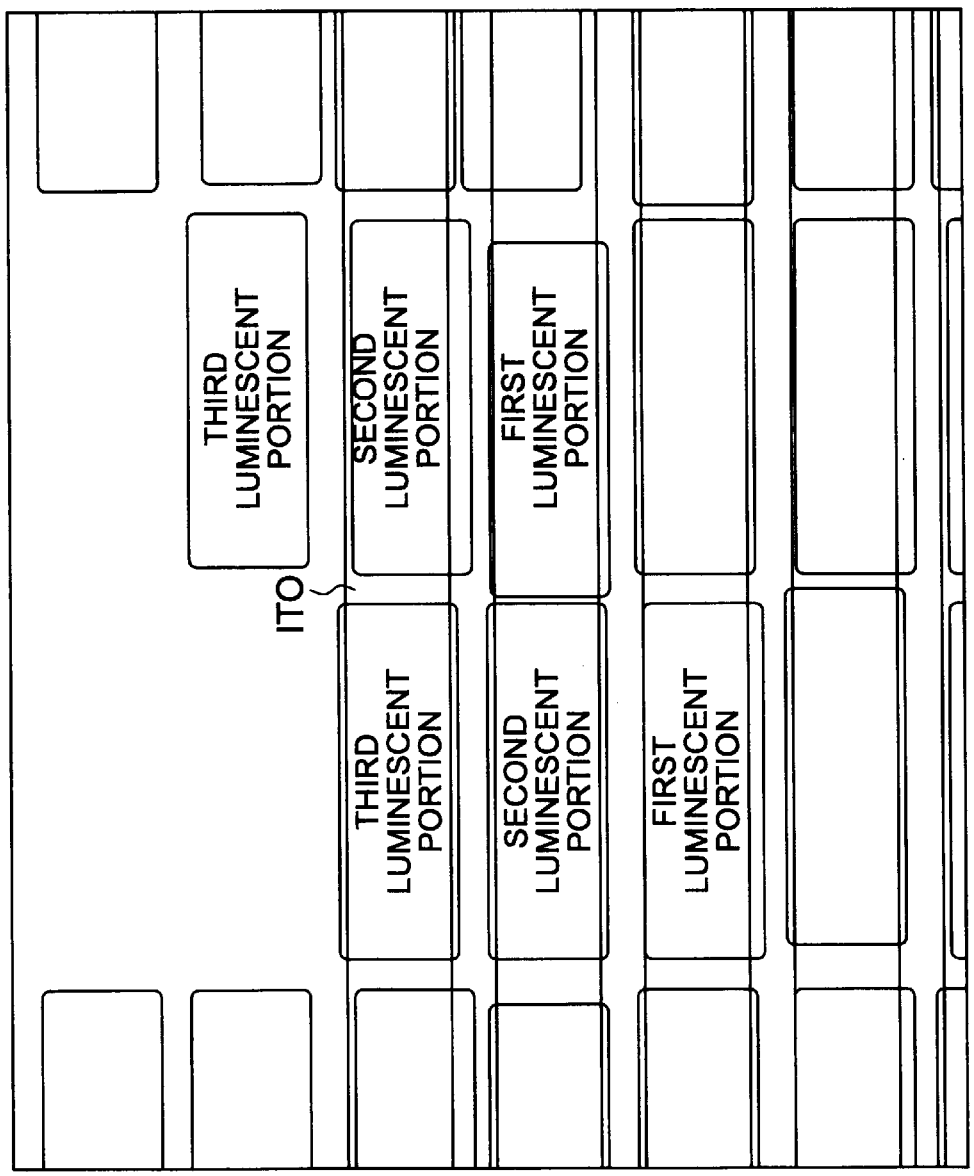
FIG. 7 is an arrangement diagram of a luminescent portion when an organic luminescent portion is formed by the use of a method of an example 1.

In this case, the deviation of several tens $\mu$m at maximum occurred in both the X direction and the Y direction, as illustrated in FIG. 7. Further, the state, in which the luminescent portions were overlapped to each other, was observed. Further, there were portions which was largely deviated from the ITO. The luminescent portions could not be finely separated under the condition of the reference example 1.

As mentioned before, the arrangement of the luminescent portions was largely deviated from the ITO line in the reference example 1 in which the electromagnet was not arranged at the back surface of the substrate.

In contrast, even when the angle between the substrate and the vaporizing source was set to a high value, namely 20 degree (when the vaporizing source was not arranged directly beneath), the luminescent portion could be formed in the predetermined position in the example 3. This is because the substrate joined with the pattern mask by the use of the magnetic field.

Example 4

A stripe-like pitch, which crossed with the ITO and had a width of 20 $\mu$m, a height of 5 $\mu$m and a pitch of 300 $\mu$m in the X direction, was formed on the substrate in which the stripe-like ITO used in the example 1 was formed by the use of the resist of the photolithography. The pattern mask illustrated in FIG. 2 was fixed to the mask holder, and was arranged in a deposition apparatus.

Next, the ITO glass substrate having the pitch was fixed to the substrate holder, and was arranged on the pattern mask set in the deposition apparatus in advance.

Under such a circumstance, the positioning alignment (marker alignment) between the pattern mask and the ITO substrate was carried out by arranging a microscope interlocked with the monitor on an upper portion of the substrate and monitoring by the monitor.

The organic EL luminescent material was filled or packed in a molybdenum board, and was arranged in a vaporizing source of load-lock system. The movable electromagnet was arranged at the backside of the substrate. Under this circumstance, the angle between the substrate and the vaporizing source was set to 20 degree under vacuum of $1.0\times10^{-4}$ Pa. Further, the electromagnet was turned on, and a first luminescent material was vacuum-vaporized at deposition rate of 0.2~0.5 nm/s to the thickness of 50 nm to a first luminescent portion.

Subsequently, the pattern mask was moved with 100 $\mu$m in the Y direction on the condition that electron-magnet was kept to the on-state. Thereafter, the angle between the substrate and the vaporizing source was set to 20 degree under vacuum of $1.0\times10^{-4}$ Pa.

Next, the vaporizing source position was changed from the first luminescent portion, and a second luminescent material was vacuum-vaporized at deposition rate of 0.2~0.5 nm/s to the thickness of 50 nm to form a second luminescent portion.

Further, the pattern mask was further moved with 100 $\mu$m in the Y direction on the condition that the electromagnet was kept to the on-state. Thereafter, the angle between the substrate and the vaporizing source was set to 20 degree under vacuum of $1.0\times10^{-4}$ Pa.

Next, the vaporizing source position was changed from the first luminescent portion and the second luminescent portion, and a third luminescent material was vacuum-vaporized at deposition rate of 0.2~0.5 nm/s to the thickness of 50 nm to form a third luminescent portion.

The arrangement state of the luminescent portions on the substrate having ITO manufactured as described above was observed. In consequence, it was found out that all of the first through the third luminescent portions were aligned on the ITO line.

As the result of the microscope observation, the deviation of the luminescent portion in the X direction and Y direction is equal to several $\mu$m at maximum, respectively, and falls within the permitted range of the ITO line and the pitch (L/S=70 $\mu$m/30 $\mu$m, namely 100 $\mu$m pitch). Further, damage was not observed on the surface of the luminescent portion at all.

Reference Example 2

The first through third luminescent portions were formed without the pitch on the ITO substrate on the condition that the electromagnet was kept to the on-state, like the example 4. When the luminescent portion obtained by the reference example 2 was observed by the use of the microscope, although the arrangement was excellent, damage was observed for a part of the surface of the luminescent portion.

As mentioned before, although the arrangement of the luminescent portion was excellent in the reference example 2 in which the pitch was not arranged on the ITO substrate, damage occurred on the surface. In contrast, the pitch was arranged on the ITO substrate in the example 4.

Thereby, even when the pattern mask was moved on the condition that the substrate joined with the pattern mask by the magnetic field, it was found out that the luminescent portion was not damaged.

Example 5
(Substrate and Pattern Mask)

Non-alkali glass (HOYA,-NA40) of 50 mm×50 mm×1.1 mm was used as the substrate. ITOs were not formed on the substrate.

The pattern mask was made of copper, and the surface thereof was plated by nickel. The pattern mask had a thickness of 34 $\mu$m.

Figure 8:
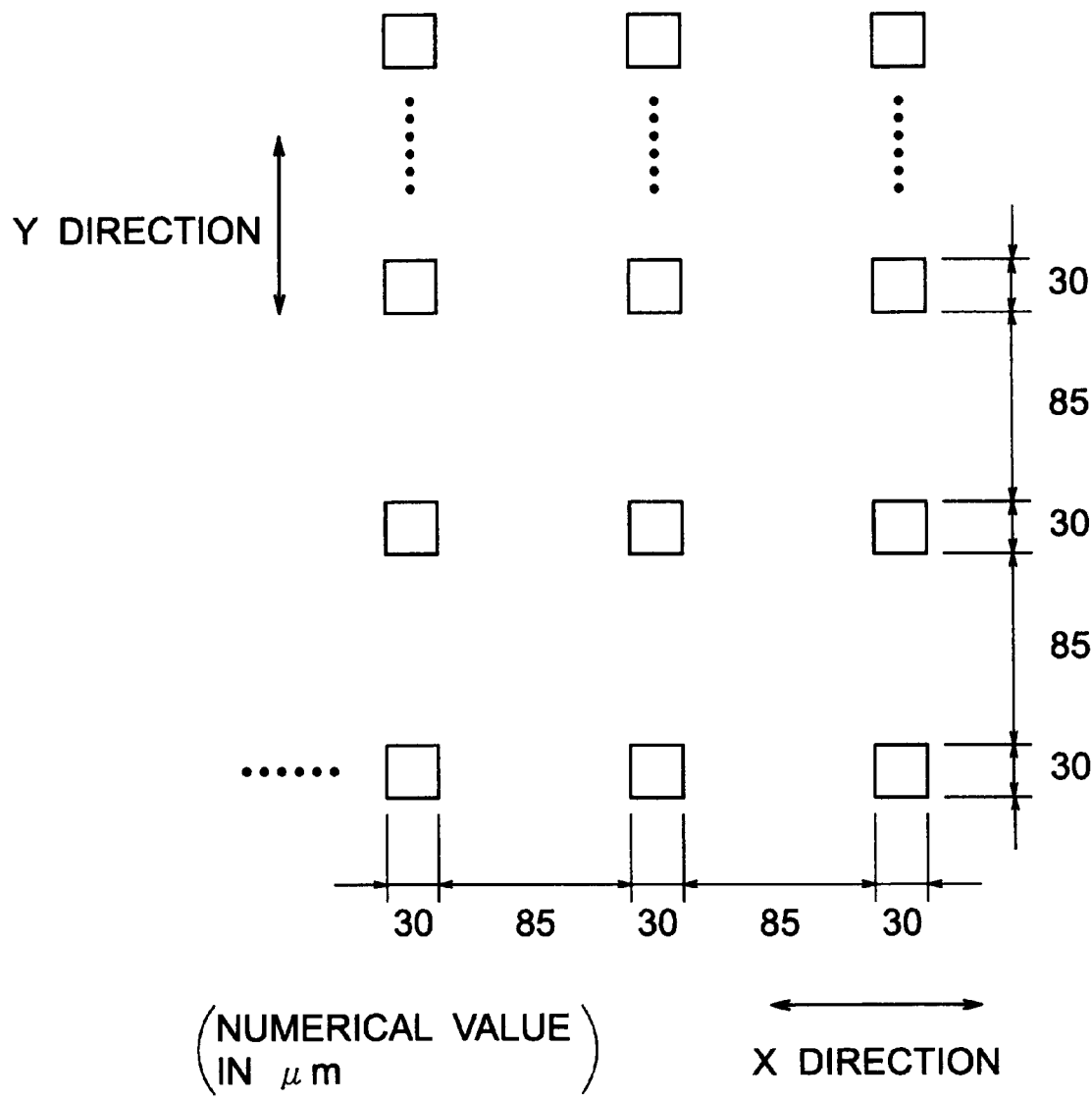
FIG. 8 is a pattern mask diagram for separating an organic luminescent portion used in an example 5 of this invention.

As illustrated in FIG. 8, a pattern hole (opening portion) forming a square sub-pixel which has X=30 $\mu$m width, Y=30 $\mu$m width, and a pitch of 85 $\mu$m in the X, Y direction was formed in the pattern mask.

Fine patterning became possible by moving the pattern mask in the both directions of the X and Y directions with a desired distance.

(Formation of the Luminescent Portion)

The pattern mask illustrated in FIG. 8 was fixed to the mask holder, and was arranged in a deposition apparatus. Next, the glass substrate was provided for the substrate holder, and was arranged on the pattern mask set in the deposition apparatus in advance.

The positioning alignment (marker alignment) between the pattern mask and the substrate and the fine movement method of the pattern mask were the same as the example 1.

The organic EL luminescent material was filled or packed in a molybdenum board, and was arranged in a vaporizing source of load-lock system.

Further, a luminescent material was vacuum-vaporized from directly beneath of the substrate at deposition rate of 0.2~0.5 nm/s under vacuum of $1.0 \times 10^{-4}$ Pa to the thickness of 50 nm.

First through ninth luminescent portions illustrated in FIG. 9 were formed by the use of nine kinds of luminescent material by finely moving the pattern mask in the X direction and Y direction by repeating the above-mentioned operation as follows.

First luminescent portion was formed under right row (original point). Next, a second and third luminescent portions were sequentially formed by finely moving with 33 $\mu$m in the Y direction (upward direction in FIG. 9). Thereby, right row (first row) was completed.

Subsequently, the pattern mask was reversed in the Y direction and returned to the original point. Thereafter, the pattern mask was moved with 33 $\mu$m in the X direction, was moved under intimidate row (second row), and a fourth luminescent portion was formed.

Similarly, the pattern mask was moved and vaporized with 33 $\mu$m in the Y direction (upward direction), and fifth and sixth luminescent portions were sequentially formed.

Likely, the pattern mask was reversed in the Y direction and returned to the position of the fourth luminescent portion. Thereafter, the pattern mask was moved with 33 $\mu$m in the X direction (light side in FIG. 9) to form a seventh luminescent portion.

Similarly, the pattern mask was moved with 33 $\mu$m. The pattern mask was reversed in the Y direction and returned to the original point. Thereafter, the pattern mask was moved with 33 $\mu$m in the Y direction (upward direction), and eighth and ninth luminescent portions were sequentially formed. Thereby, the light row (third row) was completed.

Figure 9:
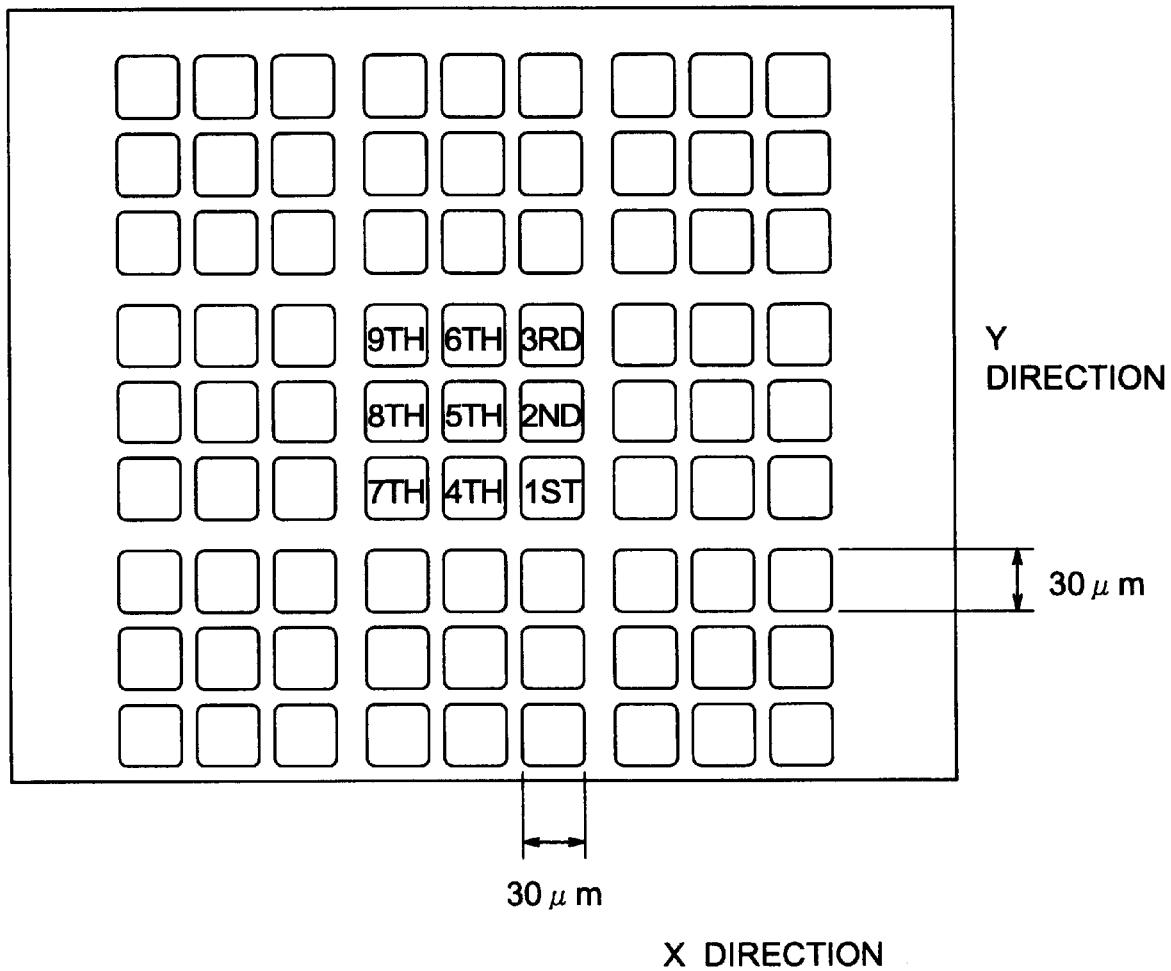
FIG. 9 is an arrangement diagram of a luminescent portion showing a fine separating example of an organic luminescent portion of an example 5 which is obtained by finely moving a pattern mask illustrated in FIG. 5.

As illustrated in FIG. 9, when the pattern mask was moved with 33 $\mu$m in the X and Y directions, the formation and the separation of the luminescent portion having the pitch of about 3 $\mu$m was achieved.

The result of the example 5 means that the separation and arrangement of the luminescent portion of 100 $\mu$m or less at trio-pixel-pitch and several tens $\mu$m at sub-pixel pitch is formed.

Accordingly, it is possible to form the luminescent portion (sub-pixel) of several tens $\mu$m unit. This means that it is possible to manufacture the full color organic thin-film EL display of fine resolution of hundred $\mu$m or less with trio-pitch by arranging the luminescent portions of blue, red and green.

As mentioned above, the pattern mask in the vacuum chamber can be moved by the use of the accurate fine moving mechanism using the pulse control motor 4 of this invention according to the manufacturing method of the organic thin-film EL device of this invention.

Thereby, the accurate positioning between the substrate and the pattern mask becomes simple. Further, the fine movement of the pattern mask is controlled in accordance with the pulse number of the pulse control motor 4. Consequently, it is possible to form the luminescent portion with fine pitch, namely several tens $\mu$m.

Further, when the manufacturing method is applied for the manufacturing process of the organic thin-film EL display, the pitch of the luminescent portion becomes about ⅓ of the pitch of the luminescent portion of the prototype of the color organic EL display in which the pitch of the luminescent portion is well-known.

Consequently, the organic EL display, which has the luminescent portion of high resolution of hundreds $\mu$m or less by trio-pitch and several tens $\mu$m by sub-pixel pitch, can be manufactured.

What is claimed is:

1. A method of manufacturing an organic thin-film electroluminescent device in which a plurality of thin-film luminescent portions, each of which is formed by organic electroluminescent material or electrode material, are arranged with fine pitches on a substrate, comprising the steps of;

arranging a mask pattern on a pattern mask moving stage which finely moves in a predetermined direction;

arranging the substrate on a substrate moving stage;

opposing the substrate against the pattern mask with a predetermined pitch;

performing an initial positioning alignment between the substrate and the pattern mask by adjusting the substrate moving stage;

vaporizing the luminescent material onto a surface of the substrate through the pattern mask;

vaporizing the luminescent material on the surface of the substrate after moving the pattern mask onto a non-vaporizing portion of the surface of the substrate by moving the pattern mask moving stage in parallel to the substrate; and whereby, forming arrangement of the luminescent portions on the surface of the substrate.

2. A method as claimed in claim 1, wherein:

the pattern mask moving stage independently and finely moves in X and Y directions perpendicular to each other for a pattern plane by controlling and driving by a pulse control motor.

3. A method as claimed in claim 2, wherein:

the pulse control motor comprises a DC servo motor.

4. A method as claimed in claim 1, wherein:

the substrate moving stage comprises a z-axis gate means which adjusts a distance and a swing angle between the substrate and the pattern mask, a rotation means which adjusts a rotation angle between the substrate and the pattern mask, and a substrate moving means which moves the substrate in parallel to the pattern mask in order to achieve fine adjustment.

5. A method as claimed in claim 4, wherein:

the z-axis gate means is finely controlled and driven by a pulse control motor.

6. A method as claimed in claim 5, wherein:

the pulse control motor comprises a DC servo motor.

7. A method as claimed in claim 4, wherein:

the rotation means is finely controlled and driven by a pulse control motor.

8. A method as claimed in claim 7, wherein:

the pulse control motor comprises a DC servo motor.

9. A method as claimed in claim 4, wherein:

the substrate moving means is finely controlled and driven by a pulse control motor.

10. A method as claimed in claim 9, wherein:
the pulse control motor comprises a DC servo motor.

11. A method as claimed in claim 1, wherein:
the pattern mask moving stage comprises a z-axis gate means which adjusts a distance and a swing angle between the substrate and the pattern mask, a rotation means which adjusts a rotation angle between the substrate and the pattern mask, and a pattern mask moving means which moves the pattern mask in parallel to the substrate in order to achieve fine adjustment.

12. A method as claimed in claim 11, wherein:
the z-axis gate means is finely controlled and driven by a pulse control motor.

13. A method as claimed in claim 12, wherein:
the pulse control motor comprises a DC servo motor.

14. A method as claimed in claim 11, wherein:
the rotation means is finely controlled and driven by a pulse control motor.

15. A method as claimed in claim 14, wherein:
the pulse control motor comprises a DC servo motor.

16. A method as claimed in claim 11, wherein:
the pattern mask moving means is finely controlled and driven by a pulse control motor.

17. A method as claimed in claim 16, wherein:
the pulse control motor comprises a DC servo motor.

18. A method as claimed in claim 1, wherein:
the pulse control motor is driven and controlled by the use of a digital input instruction system containing a feedback system.

19. A method as claimed in claim 18, wherein:
the digital input instruction comprises incremental instruction.

20. A method as claimed in claim 2, wherein:
the pulse control motor has a rotation angle sensor.

21. A method as claimed in claim 20, wherein:
the rotation angle sensor has a pulse encoder of an incremental instruction system.

22. A method as claimed in claim 1, further comprising the following steps of:
utilizing a magnetic suction pattern mask;
arranging a magnetic field generating source at a back side in which the luminescent portions are not formed on the substrate; and
whereby, sucking the pattern mask to the substrate surface by the use of the magnetic field.

23. A method as claimed in claim 1, wherein.
an insulating pitch is formed at a surface in which the luminescent portions are formed.

24. A method as claimed in claim 23, wherein:
a film thickness of the insulating pitch is thicker than a film thickness of the luminescent portion.

* * * * *